United States Patent
Li et al.

(10) Patent No.: US 9,496,873 B2
(45) Date of Patent: Nov. 15, 2016

(54) FAST LOW POWER LEVEL SHIFTERS

(71) Applicant: QUALCOMM Incorporated, San Diego, CA (US)

(72) Inventors: Shengyuan Li, Woodland Hills, CA (US); Iulian Mirea, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/451,079

(22) Filed: Aug. 4, 2014

(65) Prior Publication Data

US 2016/0036443 A1 Feb. 4, 2016

(51) Int. Cl.
| | |
|---|---|
| H03K 19/094 | (2006.01) |
| H03K 19/0185 | (2006.01) |
| H03K 3/356 | (2006.01) |
| H03K 5/24 | (2006.01) |
| H03K 19/017 | (2006.01) |

(52) U.S. Cl.
CPC ...... H03K 19/0185 (2013.01); H03K 3/35613 (2013.01); H03K 5/2481 (2013.01); H03K 19/01721 (2013.01); H03K 19/018514 (2013.01)

(58) Field of Classification Search
None
See application file for complete search history.

(56) References Cited

U.S. PATENT DOCUMENTS

| | | | |
|---|---|---|---|
| 4,047,059 A * | 9/1977 | Rosenthal | ............ H03K 5/2472 327/63 |
| 5,760,628 A | 6/1998 | Cantone et al. | |
| 5,896,043 A | 4/1999 | Kumagai | |
| 6,002,290 A * | 12/1999 | Avery | ............ H03K 3/356113 327/333 |
| 6,323,695 B1 | 11/2001 | Heinrich | |
| 6,734,704 B1 * | 5/2004 | Burkland | ......... H03K 17/04163 326/81 |
| 7,382,172 B2 * | 6/2008 | Lin | .................... H03K 3/35613 327/333 |

(Continued)

FOREIGN PATENT DOCUMENTS

WO 2013046898 A1 4/2013

OTHER PUBLICATIONS

Ali S., et al., "A Robust, Low Power, High Speed Voltage Level Shifter with Built-in Short Circuit Current Reduction," 20th European Conference on Circuit Theory and Design (ECCTD), 2011, pp. 142-145.

(Continued)

*Primary Examiner* — Long Nguyen
(74) *Attorney, Agent, or Firm* — Haynes and Boone, LLP (57) ABSTRACT

In one embodiment, a method for increasing speed of a differential input pair. The method comprises applying a first boost current to a first input of the differential input pair during a transition of a first signal applied to the first input; storing the first boost current; ending the application of the first boost current in response to the stored first boost current exceeding a first threshold; applying a second boost current to a second input of the differential input pair during a transition of a second signal applied to the second input; storing the second boost current; and ending the application of the second boost current in response to the stored second boost current exceeding a second threshold.

18 Claims, 6 Drawing Sheets

(56) References Cited

U.S. PATENT DOCUMENTS

| | | | |
|---|---|---|---|
| 7,795,946 B2 * | 9/2010 | Kim | ............ H03K 3/356113 |
| | | | 327/333 |
| 8,665,020 B2 | 3/2014 | Sakurai et al. | |
| 2007/0290736 A1 | 12/2007 | Lin et al. | |
| 2008/0048754 A1 * | 2/2008 | Woo | ............ H03K 3/35613 |
| | | | 327/333 |

OTHER PUBLICATIONS

Li Y.M., et al., "A high speed and power-efficient level shifter for high voltage buck converter drivers," 10th IEEE International Conference on Solid-State and Integrated Circuit Technology (ICSICT), 2010, pp. 309-311.

International Search Report and Written Opinion—PCT/US2015/041005—ISA/EPO—Oct. 15, 2015.

* cited by examiner

FAST LOW POWER LEVEL SHIFTERS

BACKGROUND

The disclosure relates to level shifters, and in particular, to fast low power level shifters.

Unless otherwise indicated herein, the approaches described in this section are not admitted to be prior art by inclusion in this section.

As the switching frequency of a switch mode power supply increases (such as in a multiple hundreds megahertz region), the loop delay becomes more critical. A fast and low power level shifter for a switching driver of the switch mode power supply is desired. The low power is also desired for good pulse frequency modulation (PFM) efficiency.

A first existing solution is an operational transconductance amplifier (OTA) based solution, which consumes power all the time and the speed is proportional to the current, which impact use for pulse width modulation (PWM). A second existing solution is a latch based OTA, which is too slow due to the initial effort to flip the OTA.

SUMMARY

The present disclosure provides various voltage level shifters that are fast and consume low power.

In one embodiment, the present disclosure provides a voltage level shifter that comprises a comparator having a differential input pair. An input current boost circuit boosts the current of the differential input pair during transition of an input to the differential input pair.

In one embodiment, the input current boost circuit comprises a first transistor to add the boost current to a first input of the differential input pair. A first disabling circuit turns off the first transistor. A second transistor adds the boost current to a second input of the differential input pair. A second disabling circuit turns off the second transistor.

In one embodiment, the input current boost circuit comprises a first transistor coupled to ground a first transistor of the differential input pair that has a gate coupled to a first input to the differential input pair. A first capacitor is coupled to the first transistor of the input current boost circuit to turn off the first transistor in response to charge stored therein from current through said first transistor exceeding a first threshold. A second transistor is coupled to ground a second transistor of the differential input pair that has a gate coupled to a second input to the differential input pair. A second capacitor is coupled to the second transistor of the input current boost circuit to turn off said second transistor in response to charge stored therein from current through the second transistor exceeding a second threshold.

In one embodiment, the input current boost circuit comprises a third transistor coupled in parallel to the first capacitor and having a control terminal coupled to the second input of the differential input pair. A fourth transistor is coupled in parallel to the second capacitor and has a control terminal coupled to the first input of the differential input pair.

In one embodiment, the comparator further comprises a summing circuit to generate a voltage signal based on added currents in the differential input pair. The summing circuit operating in a different voltage domain than the voltage domain of the differential input pair.

In one embodiment, the comparator further comprises an inverter to invert the voltage signal. The inverter operates in the different voltage domain.

In one embodiment, the transitions of the input to the differential input pair are based on a pulse frequency modulation mode of operation.

In another embodiment, the disclosure provides a voltage level shifter comprising means for comparing a first voltage on a first input to a second voltage on a second input to generate an output signal based on the comparison; and means for increasing current of the means for comparing during a transition of the first voltage or the second voltage.

In one embodiment, the means for increasing current comprises first means for adding a first boost current to a first input of the means for comparing during a transition of the first voltage; first means for disabling the first means for adding a first boost current; second means for adding a second boost current to a second input of the means for comparing during a transition of the second voltage; and second means for disabling the second means for adding a second boost current.

In one embodiment, the first means for disabling the first means for adding a first boost current disables said first means for adding after the transition of the first voltage. The second means for disabling the first means for adding a second boost current disables said second means for adding after the transition of the second voltage.

In one embodiment, the means for increasing current comprises first means for adding a first boost current to a first input of the means for comparing during a transition of the first voltage; first means for accumulating the first boost current to disable the first means for adding a first boost current in response to the accumulated first boost current reaching a first threshold; second means for adding a second boost current to a second input of the means for comparing during a transition of the second voltage; and second means for accumulating the second boost current to disable the second means for adding a second boost current in response to the accumulated second boost current reaching a second threshold.

In one embodiment, the means for increasing current further comprises first means for discharging the accumulated first boost current in the first means for accumulating the first boost current during a time the second boost current is being accumulated; and second means for discharging the accumulated second boost current in the second means for accumulating the second boost current during a time the first boost current is being accumulated.

In one embodiment, the means for comparing includes a differential input pair and means for summing currents in the differential input pair to generate a voltage signal. The voltage signal is in a different voltage domain than the voltage domain of the differential input pair.

In one embodiment, the means for comparing further comprises means for inverting the voltage signal. The means for inverting operates in the different voltage domain.

In another embodiment, the disclosure provides a method for increasing speed of a differential input pair. The method comprises applying a first boost current to a first input of the differential input pair during a transition of a first signal applied to the first input; storing the first boost current; ending the application of the first boost current in response to the stored first boost current exceeding a first threshold; applying a second boost current to a second input of the differential input pair during a transition of a second signal applied to the second input; storing the second boost current; and ending the application of the second boost current in response to the stored second boost current exceeding a second threshold.

In one embodiment, the first boost current is stored in a first capacitor and the second boost current is stored in a second capacitor.

In one embodiment, the method further comprises discharging the first capacitor during the transition of the second signal applied to the second input; and discharging the second capacitor during the transition of the first signal applied to the first input.

In one embodiment, the method further comprises discharging the first capacitor before a subsequent transition of the first signal applied to the first input; and discharging the second capacitor during a subsequent transition of the second signal applied to the second input.

In one embodiment, the method further comprises summing currents in the differential input pair to generate a voltage signal in a different voltage domain than the voltage domain of the differential input pair.

In one embodiment, the method further comprises inverting the voltage signal in the different voltage domain.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
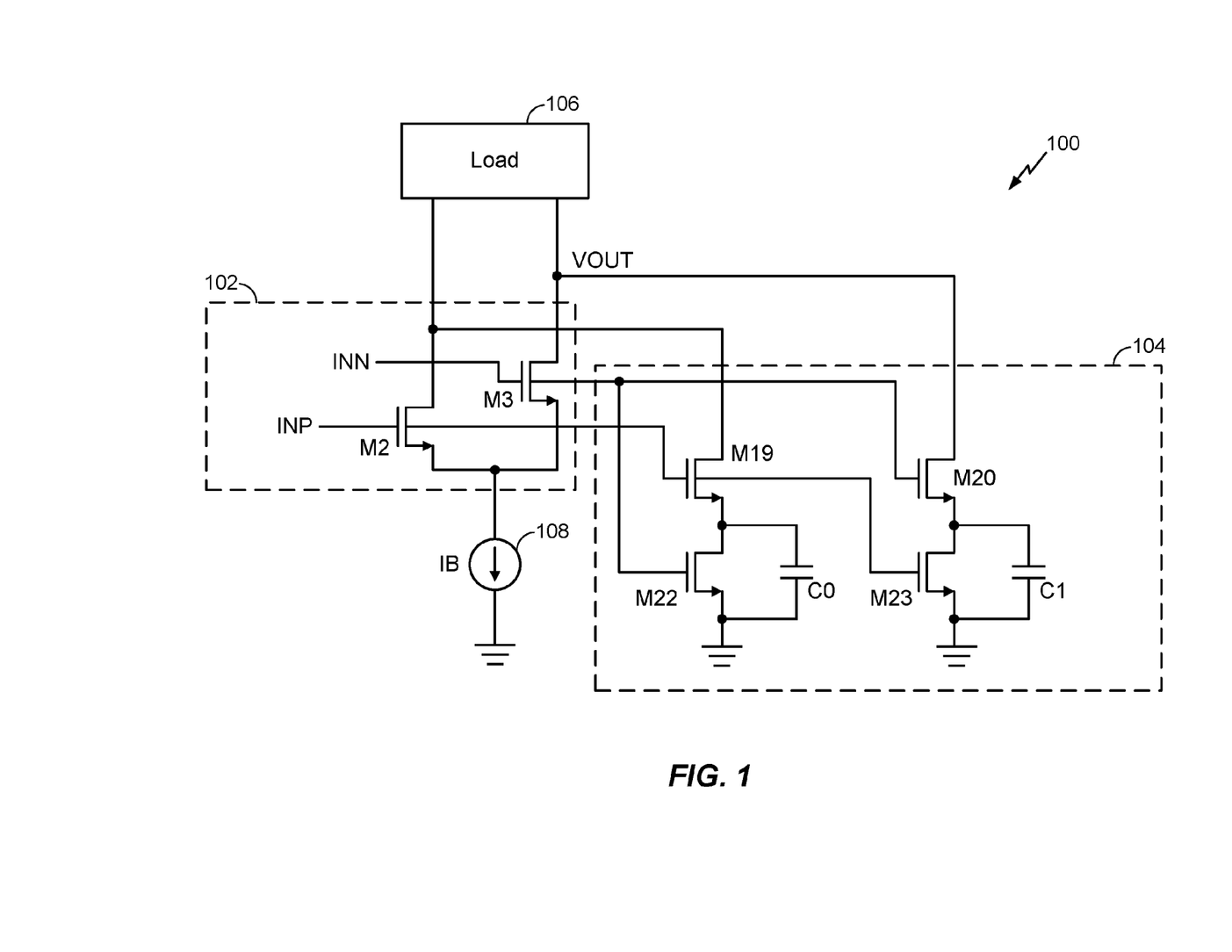
FIG. 1 illustrates a block diagram of a voltage level shifter according to an embodiment.

FIG. 1 illustrates a block diagram of a voltage level shifter 100 according to an embodiment. Voltage level shifter 100 comprises a differential input pair 102, an input current boost circuit 104, a load circuit 106, and a tail current source 108. As shown in FIG. 1, differential input pair 102 comprises a plurality of NMOS transistors M2 and M3 that generate currents based on differential inputs INP and INM, respectively, and load 106. Transistor M3 generates an output voltage VOUT based on the generated currents.

Input current boost circuit 104 comprises a plurality of NMOS transistors M19, M20, M22, and M23, and a plurality of capacitors C0 and C1. Input current boost circuit 104 introduces extra current to differential input pair 102 only during the switching phase of the inputs INP and INM to speed up the transition. Transistors M19 and M20 provide the extra current to differential input pair 102. Capacitors C0 and C1 store or accumulate the charge from the currents provided by transistors M19 and M20, respectively. Transistors M22 and M23 are coupled across capacitors C0 and C1, respectively, to ground and discharge the respective capacitor.

When the input transition edge occurs, such as input INP toggling from Low to High, transistor M19 is turned on hard to provide extra current to speed up the transition. At turn on of transistor M19, capacitor C0 has no charge, and thus the voltage across capacitor C0 is zero, so that the source of transistor M19 is initially at ground. The current through transistor M19 charges capacitor C0. As input INP transitions high, the voltage across capacitor C0 increases to lower the VGS of transistor M19 and to turn off transistor M19. Transistor M19 speeds up the transition, and turning off transistor M19 after the transition conserves power. Transistor M23 turns on and discharges capacitor C1, so that capacitor C1 is at ground for the transition of input INP from high to low. Capacitors C0, C1 function as disabling circuits to switch or turn off the respective transistors M19, M20 when the capacitors are sufficiently charged. After the logic level of differential input pair 102 flips, the bias current IB of tail current source 108 can be reduced to a level to maintain the output level (VOUT).

An input transition edge of input INN functions in a similar manner for turning on transistor M20, charging capacitor C1, and turning off transistor M20. Transistor M20 speeds up the transition, and turning off transistor M20 after the transition conserves power.

In one embodiment, capacitors C0 and C1 are about 100 femtofarads ($10^{-15}$ farads).

Figure 2:
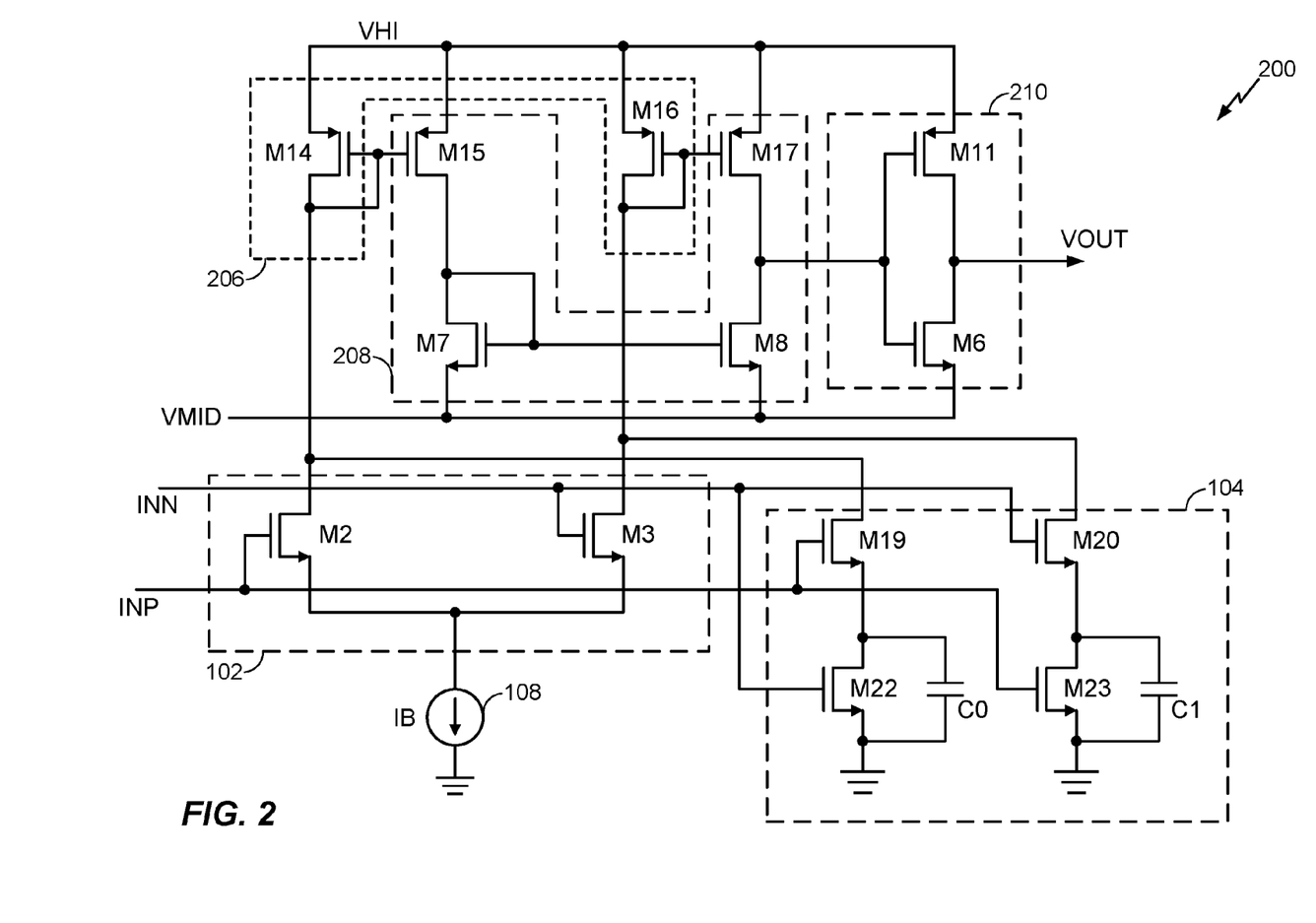
FIG. 2 illustrates a block diagram of a voltage level shifter according to another embodiment.

FIG. 2 illustrates a block diagram of a voltage level shifter 200 according to an embodiment. Voltage level shifter 200 converts the differential inputs (INP/INM) that are in a first voltage domain (in this example, voltages VDD/VSS, not shown in FIG. 2) into a single-ended output (VOUT) in a different second voltage domain (in this example, voltages VHI/VMID) for driving a switching driver, for example. Voltage level shifter 200 comprises a differential input pair 102, an input current boost circuit 104, a tail current source 108, a load circuit 206, a summing circuit 208, and an output inverter 210. Load circuit 206 comprises PMOS transistors M14 and M16 for actively loading differential input pair 102. The differential input pair 102 generates currents (e.g., by using current mirrors), which are provided to summing circuit 208. Summing circuit 208 comprises PMOS transistors M15 and M17 and NMOS transistors M7 and M8. Transistor M15 forms a current mirror with transistor M14 to mirror the current of transistor M14 in transistor M15. Transistor M8 forms a current mirror with transistor M7. The two current mirrors mirror the current of input transistor M2 in transistor M8. Transistor M17 forms a current mirror with transistor M16 to mirror the current of transistor M16 in transistor M17. Transistor M17 mirrors the current of input transistor M3. The currents in transistors M17 and M8 reflect the sum of the currents in transistor M2 and transistor M3. Summing circuit 208 sums the currents from the differential input pair 102 and applies the summed current as reflected on the drain of transistor M17 to output inverter 210 formed of a PMOS transistor M11 and an NMOS transistor M6. Output inverter 210 generates a single ended output voltage. The output of summing circuit 208 is provided to output inverter 210 that generates a single ended output voltage (VOUT). Output inverter 210 operates with the different voltage domain (in this example, voltage rails VHI/VMID).

Figure 3:
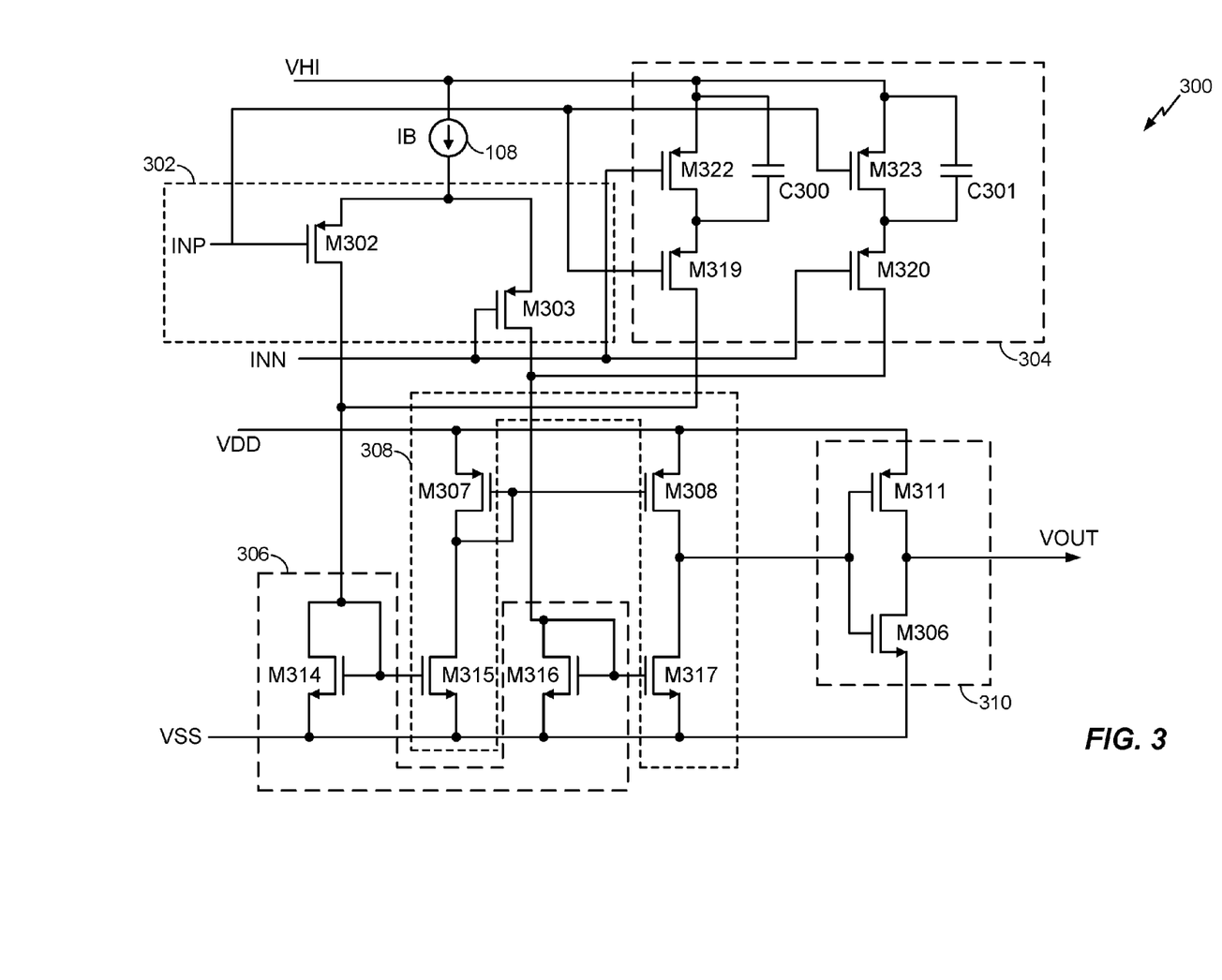
FIG. 3 illustrates a block diagram of a voltage level shifter according to yet another embodiment.

FIG. 3 illustrates a block diagram of a voltage level shifter 300 according to an embodiment. Voltage level shifter 300 includes a comparator analogous to voltage level shifter 200 that is flipped from VDD to VSS. Voltage level shifter 300 converts the differential inputs (INP/INM) that are in a first voltage domain (in this example, voltages VHI/VMID, not shown in FIG. 3) into a single-ended output (VOUT) in a different second voltage domain (in this example, voltages VDD/VSS) for driving a switching driver, for example. Voltage level shifter 300 comprises a differential input pair 302, an input current boost circuit 304, a tail current source 108, a load circuit 306, a summing circuit 308, and an output inverter 210. Load circuit 306 comprises NMOS transistors M314 and M316 for actively loading differential input pair 302. The differential input pair 302 formed of transistors M302 and M303 generates currents (e.g., by using current mirrors), which are provided to summing circuit 308.

Input current boost circuit 304 comprises a plurality of PMOS transistors M319, M320, M322 and M323, and a plurality of capacitors C300 and C301 arranged in a flipped configured as input current boost circuit 104 described above and operate in a similar manner. When the input transition edge occurs, such as input INP toggling from High to Low, transistor M319 is turned on hard to provide extra current to speed up the transition. At turn on of transistor M319, capacitor C300 has no charge, and thus the voltage across capacitor C300 is zero, so that the source of transistor M319 is initially at voltage VHI. The current through transistor M319 charges capacitor C0. As input INP transitions Low, the voltage across capacitor C0 increases to lower the VGS of transistor M319 and to turn off transistor M319. Transistor M319 speeds up the transition, and turning off transistor M319 after the transition conserves power. Transistor M323 turns on and discharges capacitor C301, so that capacitor C301 is at voltage VHI for the transition of input INP from Low to High. Capacitors C300, C301 function as disabling circuits to switch or turn off the respective transistors M319, M320 when the capacitors are sufficiently charged. After the logic level of differential input pair 302 flips, the bias current TB of tail current source 108 can be reduced to a level to maintain the output level (VOUT).

Summing circuit 308 comprises NMOS transistors M315 and M317 and PMOS transistors M307 and M308. Transistor M315 forms a current mirror with transistor M314 to mirror the current of transistor M314 in transistor M315. Transistor M308 forms a current mirror with transistor M307. The two current mirrors mirror the current of input transistor M302 in transistor M308. Transistor M317 forms a current mirror with transistor M316 to mirror the current of transistor M316 in transistor M317. Transistor M317 mirrors the current of input transistor M303. The currents in transistors M317 and M308 reflect the sum of the currents in transistor M302 and transistor M303. Summing circuit 302 sums the currents from the differential input pair 302 and applies the summed current as reflected on the drain of transistor M317 to output inverter 310 formed of a PMOS transistor M311 and an NMOS transistor M306. Output inverter 310 generates a single ended output voltage. The output of summing circuit 308 is provided to output inverter 310 that generates a single ended output voltage (VOUT). Output inverter 310 operates with the different voltage domain (in this example, voltage rails VDD/VSS).

Figure 4:
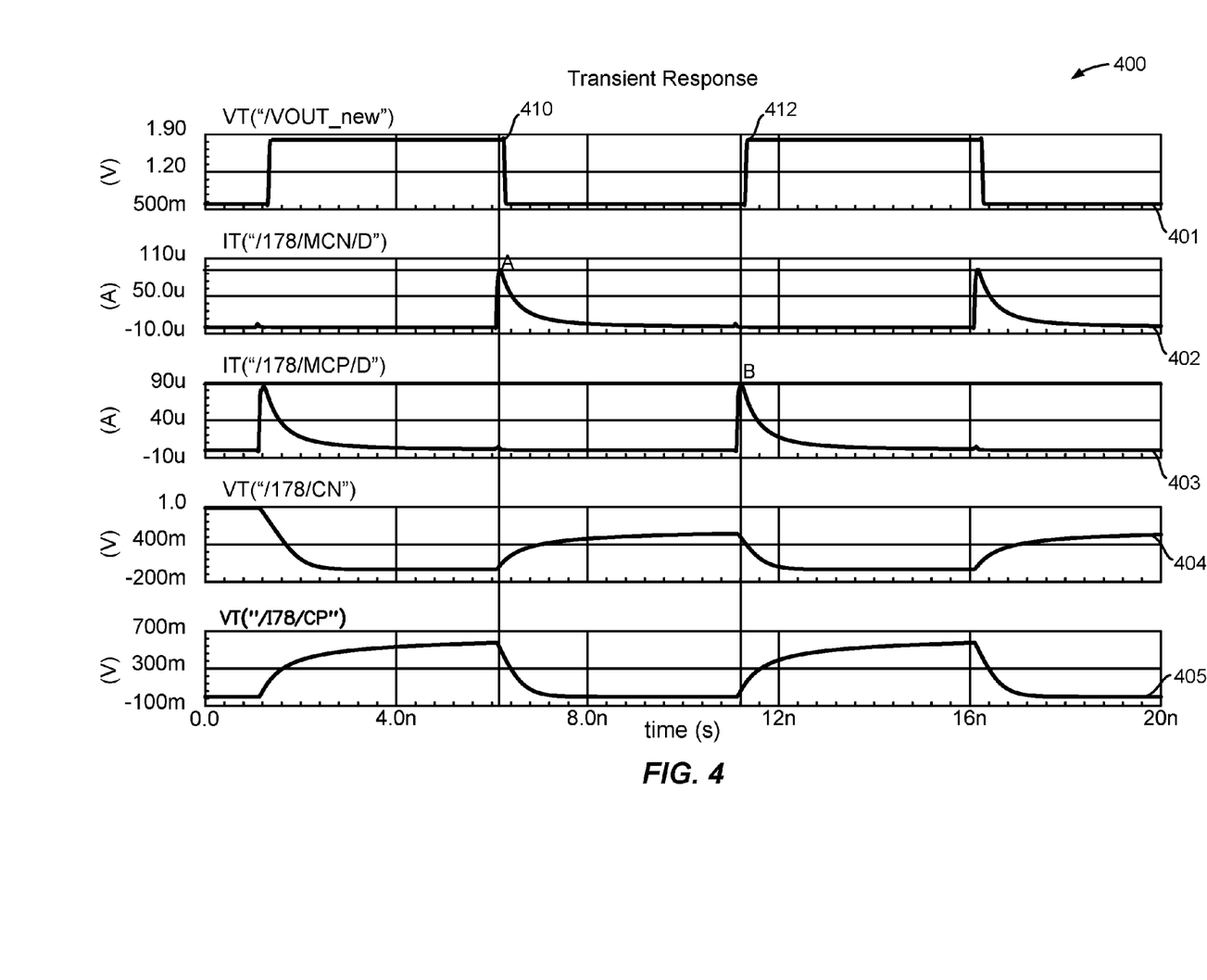
FIG. 4 illustrates timing diagrams of a voltage level shifter according to an embodiment.

FIG. 4 illustrates timing diagrams of in an illustrative example of voltage level shifter 200. A line 401 illustrates the output voltage (VOUT). A line 402 illustrates the current through the source of NMOS transistor M20. A line 403 illustrates the current through the source of NMOS transistor M19. A line 404 illustrates the voltage across capacitor C1. A line 405 illustrates the voltage across capacitor C0. At a time 410, the input to differential input pair 102 transitions (in this example, input INP transitions high to low not shown in FIG. 4). Line 402 illustrates the current through the source of NMOS transistor M20 having a rapid turn on and a rapid turn off, and line 404 illustrates the voltage across capacitor C1, increasing which causes transistor M20 to turnoff. At time 410, line 405 shows the voltage across capacitor C1 dropping as capacitor C1 discharges. Shortly after time 410, the output voltage VOUT transitions high to low in response to the transition of the input to the differential input pair 102.

At a time 412, the input to differential input pair 102 transitions (in this example, input INP transitions low to high—not shown in FIG. 4). Line 403 illustrates the current through the source of NMOS transistor M19 having a rapid turn on and a rapid turn off, and line 405 illustrates the voltage across capacitor C0, increasing which causes transistor M19 to turnoff. At time 412, line 404 shows the voltage across capacitor C0 dropping as capacitor C0 discharges. Shortly after time 412, the output voltage VOUT transitions low to high in response to the transition of the input to the differential input pair 102.

Figure 5:
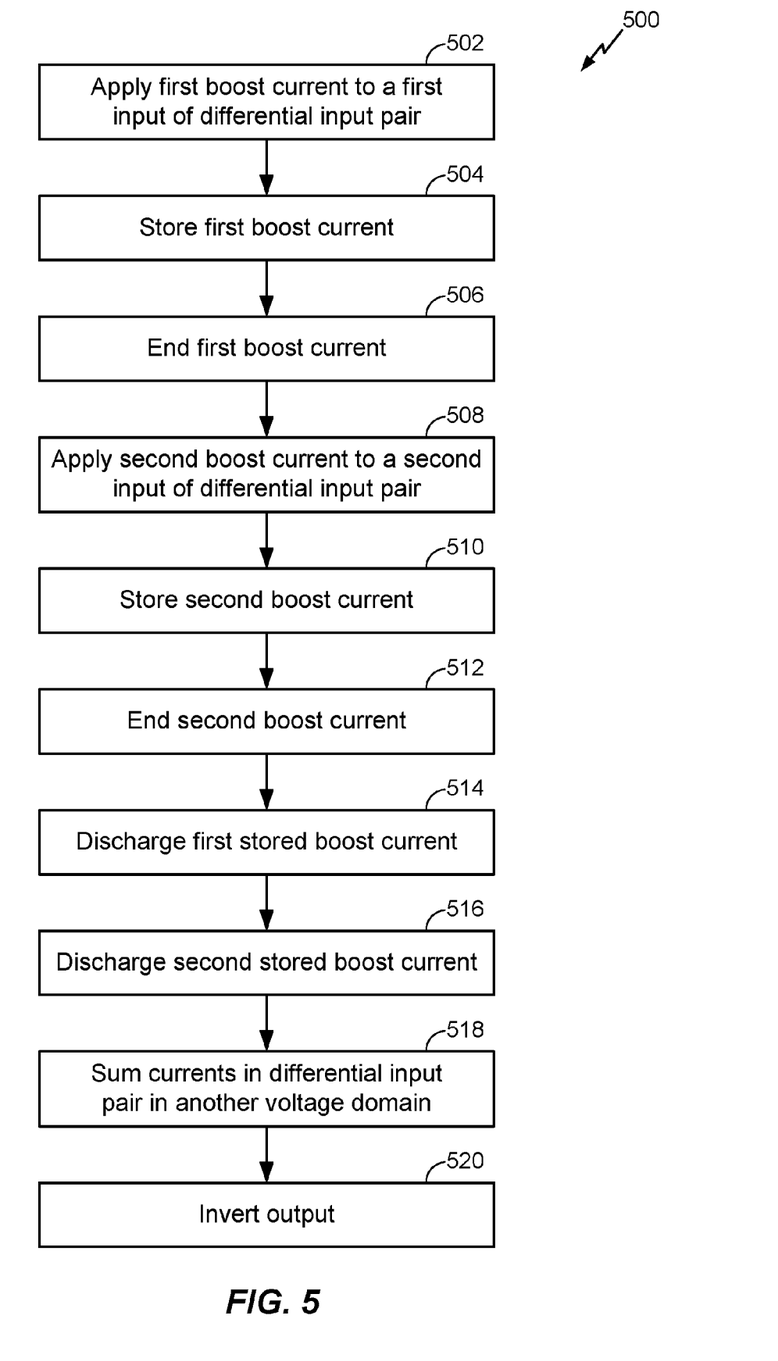
FIG. 5 illustrates a simplified diagram illustrating a process flow for transition control of a voltage level shifter according to an embodiment.

FIG. 5 illustrates a simplified diagram illustrating a process flow 500 for transition control of a voltage level shifter according to an embodiment.

Although process flow 500 is described for voltage level shifter 200, the process flow may be applied for other voltage level shifters. Process flow 500 may be used for transition control or increasing speed of differential input pair 102.

At 502, a first boost current is applied to a first input (NMOS transistor M2) of differential input pair 102 during a transition of a first signal INP applied to the first input. At 504, the first boost current from NMOS transistor M19 is stored (e.g., in capacitor C0). At 506, the application of the first boost current is ended in response to the stored first boost current exceeding a first threshold. In this example, the voltage on the capacitor C0 reaches a voltage to increase the source of NMOS transistor M19 to a level to shut off NMOS transistor M19.

At 508, a second boost current is applied to a second input (NMOS transistor M3) of the differential input pair 102 during a transition of a second signal INM applied to the second input. At 510, the second boost current from NMOS transistor M20 is stored (e.g., in capacitor C1). At 512, the application of the second boost current is ended in response to the stored second boost current exceeding a second threshold. In this example, the voltage on the capacitor C1 reaches a voltage to increase the source of NMOS transistor M20 to a level to shut off NMOS transistor M19.

At 514, the stored first boost current in the first capacitor is discharged during the transition of the second signal applied to the second input. The first capacitor may be discharged at any time before the first capacitor is used for charging during the first current boost.

At 516, the stored second boost current in the second capacitor is discharged during the transition of the first signal applied to the first input. The second capacitor may be discharged at any time before the second capacitor is used for charging during the second current boost.

At 518, currents in the differential input pair are mirrored and summed (in this example, by summing circuit 208) to generate a voltage signal that is in a different voltage domain than the voltage domain of differential input pair 102. At 520, inverting the voltage signal is inverted in the different voltage domain (e.g., the voltage domain of summing circuit 208).

Figure 6:
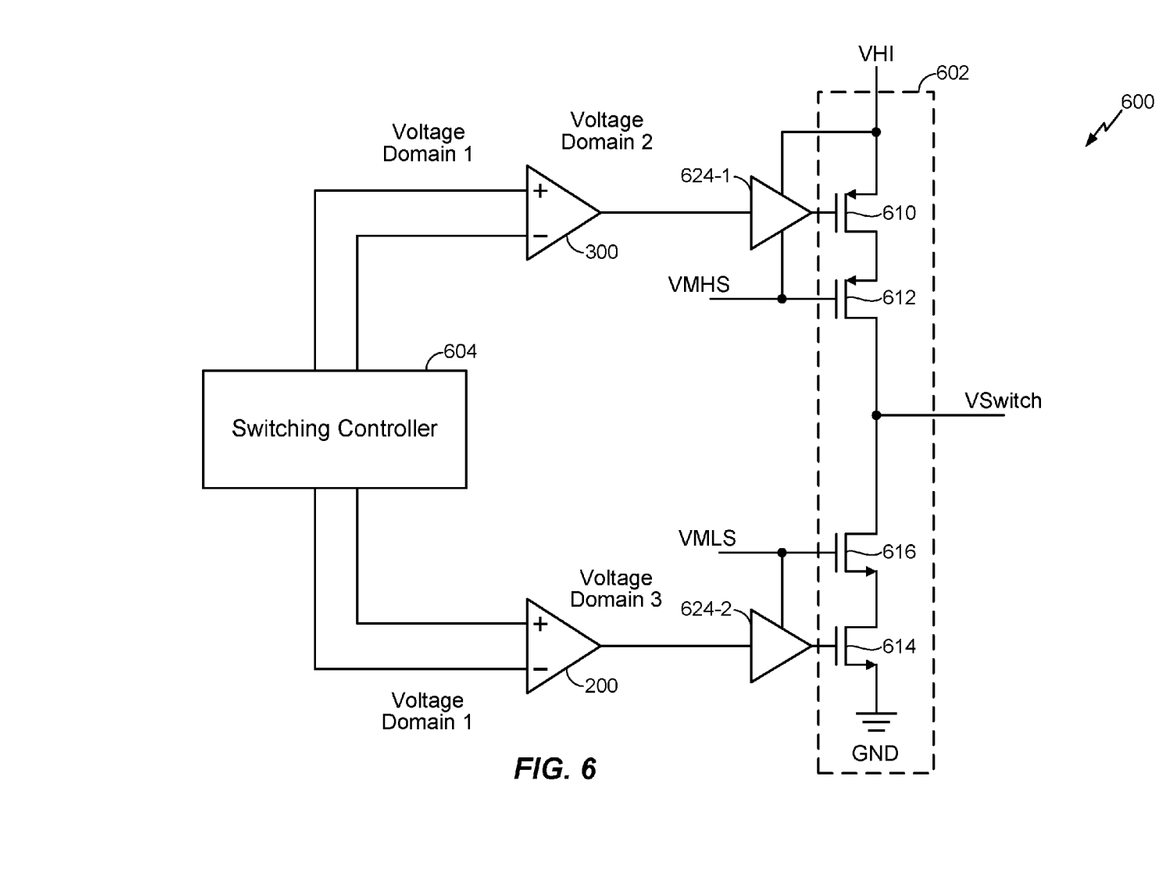
FIG. 6 illustrates a block diagram of a switching driver according to an embodiment.

FIG. 6 illustrates a block diagram of a switching driver 600 according to an embodiment. Switching driver 600 comprises a field effect transistor (FET) switching driver 602, a switching controller, a voltage level shifter 300, and a voltage level shifter 200.

FET switching driver 602 can be used for driving a switching regulator, such as a buck convertor. FET switching driver 602 comprises a high side that includes a high side switching power transistor 610 and a high side cascode transistor 612, and comprises a low side that includes a low side switching power transistor 614 and a low side cascode transistor 616. Cascode transistors 612 and 616 are high side and low side cascode transistors, respectively, to reduce voltage drop across switching power transistors 610 and 614, respectively.

The high side switching power transistor 610 is driven by switching driver 624-1 that has voltage rails of VHI (e.g., 3.7 V) and a high side voltage VMHS (e.g., 1.2 V). The high side cascode transistor 612 is biased by the high side voltage VMHS. The low side switching power transistor 614 is driven by switching driver 624-2 that has voltage rails of low side voltage VMLS (e.g., 2.5 V) and a ground. The low side cascode transistor 616 is biased by the low side voltage VMLS. Switching drivers 624-1 and 624-2 provide switching signals to the gates of the switching power transistors 610 and 616, respectively, in response to a control signal from voltage level shifter 300 and voltage level shifter 200, respectively. Voltage level shifter 300 operates between voltage domains 1 (VDD/VSS) and voltage domain 2 (VHI/VMHS). Voltage level shifter 200 operates between voltage domains 1 (VDD/VSS) and voltage domain 3 (VMLS/GND). Switching controller 604 provides control signals to the inputs of voltage level shifter 300 and voltage level shifter 200 to control the switching, such as in a pulse frequency modulation (PFM) mode, of switching driver 602. These control signals control the boost current on the differential input pairs of voltage level shifter 300 and voltage level shifter 200.

In various embodiments, the voltage level shifters use lower current, and thus lower power in a pulse frequency modulation (PFM) mode.

In various embodiments, the speed of the voltage level shifters is proportional to the current in a pulse width modulation (PWM) mode. This can provide hundreds of Megahertz for a switching regulator. In various embodiments, the voltage level shifters level shifters do both.

In various embodiments, the voltage level shifters can be used for buck regulators, such as those that operate in ultra high frequency (UHF) such as 100 MHz range. Such voltage level shifters achieve high good PFM efficiency. For example, the voltage level shifter described in conjunction with FIG. 4 achieves about 260 picosecond propagation delay (tpd) with only 4 microamps in standard 65 nanometer CMOS technology compared with about 580 picosecond tpd propagation delay with 16 microamps static current using operational transconductance amplifier (OTA) based solution.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
a comparator having a differential input pair comprising a first differential transistor and a second differential transistor; and
an input current boost circuit to boost a current of the differential input pair during transition of at least one input to the differential input pair, the input current boost circuit comprising:
a first transistor configured to apply a first voltage to the first differential transistor of the differential input pair, the first transistor having a gate coupled to a first input of the at least one input to the differential input pair;
a first capacitor coupled to the first transistor to turn off said first transistor in response to charge stored therein from current through said first transistor;
a second transistor configured to apply a second voltage to the second differential transistor of the differential input pair, the second transistor having a gate coupled to a second input of the at least one input to the differential input pair;
a second capacitor coupled to the second transistor to turn off said second transistor in response to charge stored therein from current through said second transistor;
a third transistor coupled in parallel to the first capacitor and having a control terminal coupled to the second input of the differential input pair; and
a fourth transistor coupled in parallel to the second capacitor and having a control terminal coupled to the first input of the differential input pair,
wherein, in response to a first transition of the first and second inputs to the differential input pair, the first differential transistor turns on, the second differential transistor and the second transistor are off, and the first transistor initially turns on and then turns off as a voltage on the first capacitor increases, and
wherein, in response to a second transition of the first and second inputs to the differential pair, the second differential transistor turns on, the first differential transistor and the first transistor are off, and the second transistor initially turns on and then turns off as a voltage on the second capacitor increases,
the circuit further comprising a load circuit having inputs coupled to outputs of the differential input pair, the load circuit comprising a plurality of current mirrors, a summing circuit, and an inverter, wherein at least one current mirror comprises a first current mirror transistor coupled between a first reference voltage and a second reference voltage and a second current mirror transistor coupled between the first reference voltage and a third reference voltage.

2. The circuit of claim 1 wherein the first differential transistor, the second differential transistor, the first transistor, the second transistor, the third transistor, and the fourth transistor are NMOS transistors.

3. The circuit of claim 1 wherein the first differential transistor, the second differential transistor, the first transistor, the second transistor, the third transistor, and the fourth transistor are PMOS transistors.

4. A circuit comprising:
a first differential transistor comprising a first terminal, a second terminal, and a control terminal;
a second differential transistor comprising a first terminal, a second terminal, and a control terminal, wherein the first terminal of the first differential transistor is coupled to the first terminal of the second differential transistor;
a first transistor comprising a control terminal, a first terminal, and a second terminal, wherein the control terminal of the first transistor is coupled to the control terminal of the first differential transistor and the second terminal of the first transistor is coupled to the second terminal of the first differential transistor;
a second transistor comprising a control terminal, a first terminal, and a second terminal, wherein the control terminal of the second transistor is coupled to the control terminal of the second differential transistor, the first terminal of the second transistor is coupled to a reference voltage, and the second terminal of the second transistor is coupled to the first terminal of the first transistor;
a third transistor comprising a control terminal, a first terminal, and a second terminal, wherein the control terminal of the third transistor is coupled to the control terminal of the second differential transistor and the second terminal of the third transistor is coupled to the second terminal of the second differential transistor;
a fourth transistor comprising a control terminal, a first terminal, and a second terminal, wherein the control terminal of the fourth transistor is coupled to the control terminal of the first differential transistor, the first terminal of the fourth transistor is coupled to the reference voltage, and the second terminal of the fourth transistor is coupled to the first terminal of the third transistor;
a first capacitor having a first terminal coupled to the first terminal of the second transistor and a second terminal coupled to the second terminal of the second transistor; and
a second capacitor having a first terminal coupled to the first terminal of the fourth transistor and a second terminal coupled to the second terminal of the fourth transistor,
wherein, in response to a first transition of the control terminals of the first and second differential transistors, the first differential transistor turns on, the second differential transistor and the third transistor are off, and the first transistor initially turns on and then turns off as a voltage on the first capacitor increases, and
wherein, in response to a second transition of the control terminals of the first and second differential transistors, the second differential transistor turns on, the first differential transistor and the first transistor are off, and the third transistor initially turns on and then turns off as a voltage on the second capacitor increases.

5. The circuit of claim 4 wherein the first differential transistor, the second differential transistor, the first transistor, the second transistor, the third transistor, and the fourth transistor are NMOS transistors.

6. The circuit of claim 4 wherein the first differential transistor, the second differential transistor, the first transistor, the second transistor, the third transistor, and the fourth transistor are PMOS transistors.

7. The circuit of claim 4 wherein the reference voltage is ground.

8. The circuit of claim 4 wherein the reference voltage is a voltage rail.

9. The circuit of claim 4 further comprising a load circuit having a first input coupled to the second terminal of the first differential transistor and a second input coupled to the second terminal of the second differential transistor.

10. The circuit of claim 9 wherein the reference voltage is a first reference voltage, the load circuit comprising a plurality of current mirrors, a summing circuit, and an inverter, wherein at least one current mirror comprises a first current mirror transistor coupled between the first reference voltage and a second reference voltage and a second current mirror transistor coupled between the second reference voltage and a third reference voltage.

11. The circuit of claim 9, the load circuit comprising:
a first current mirror having a first terminal and a second terminal, wherein the first terminal of the first current mirror is coupled to the second terminal of the first differential transistor;
a second current mirror having a first terminal and a second terminal, wherein the first terminal of the second current mirror is coupled to the second terminal of the first current mirror; and
a third current mirror having a first terminal and a second terminal, wherein the first terminal of the third current mirror is coupled to the second terminal of the second differential transistor and the second terminal of the third current mirror is coupled to the second terminal of the second current mirror.

12. The circuit of claim 4 wherein the circuit is a voltage level shift circuit.

13. A circuit comprising:
a first switching power transistor having a first terminal coupled to a first voltage rail and a second terminal coupled to a switch node;
a second switching power transistor having a first terminal coupled to the switch node and a second terminal coupled to a second voltage rail;
a switching controller;
a first level shift circuit coupled between a first output of the switching controller and a gate of the first switching power transistor; and
a second level shift circuit coupled between a second output of the switching controller and a gate of the second switching power transistor,
at least one of the first level shift circuit and the second level shift circuit comprising:
a first differential transistor comprising a first terminal, a second terminal, and a control terminal;
a second differential transistor comprising a first terminal, a second terminal, and a control terminal, wherein the first terminal of the first differential transistor is coupled to the first terminal of the second differential transistor;
a first transistor comprising a control terminal, a first terminal, and a second terminal, wherein the control terminal of the first transistor is coupled to the control terminal of the first differential transistor and the second terminal of the first transistor is coupled to the second terminal of the first differential transistor;

a second transistor comprising a control terminal, a first terminal, and a second terminal, wherein the control terminal of the second transistor is coupled to the control terminal of the second differential transistor, the first terminal of the second transistor is coupled to a reference voltage, and the second terminal of the second transistor is coupled to the first terminal of the first transistor;

a third transistor comprising a control terminal, a first terminal, and a second terminal, wherein the control terminal of the third transistor is coupled to the control terminal of the second differential transistor and the second terminal of the third transistor is coupled to the second terminal of the second differential transistor;

a fourth transistor comprising a control terminal, a first terminal, and a second terminal, wherein the control terminal of the fourth transistor is coupled to the control terminal of the first differential transistor, the first terminal of the fourth transistor is coupled to the reference voltage, and the second terminal of the fourth transistor is coupled to the first terminal of the third transistor;

a first capacitor having a first terminal coupled to the first terminal of the second transistor and a second terminal coupled to the second terminal of the second transistor; and a second capacitor having a first terminal coupled to the first terminal of the fourth transistor and a second terminal coupled to the second terminal of the fourth transistor, wherein, in response to a first transition of the control terminals of the first and second differential transistors, the first differential transistor turns on, the second differential transistor and the third transistor are off, and the first transistor initially turns on and then turns off as a voltage on the first capacitor increases, and wherein, in response to a second transition of the control terminals of the first and second differential transistors, the second differential transistor turns on, the first differential transistor and the first transistor are off, and the third transistor initially turns on and then turns off as a voltage on the second capacitor increases.

14. The circuit of claim 13 wherein the circuit is a switching regulator.

15. The circuit of claim 13 further comprising a first cascode transistor having a first terminal coupled to the second terminal of the first switching power transistor and a second terminal coupled to the switch node and a second cascode transistor having a first terminal coupled to the switch node and a second terminal coupled to the first terminal of the second switching power transistor.

16. The circuit of claim 13, wherein at least one of the first level shift circuit and the second level shift circuit further comprising a load circuit having a first input coupled to the second terminal of the first differential transistor and a second input coupled to the second terminal of the second differential transistor.

17. The circuit of claim 16, the load circuit comprising a plurality of current mirrors, a summing circuit, and an inverter.

18. The circuit of claim 16, wherein the reference voltage is a first reference voltage, the load circuit comprising:
a first current mirror transistor coupled between the first reference voltage and a second reference voltage; and
a second current mirror transistor coupled between the second reference voltage and a third reference voltage.

* * * * *